United States Patent
Hillman et al.

(10) Patent No.: US 10,994,300 B2
(45) Date of Patent: May 4, 2021

(54) METHOD AND/OR SYSTEM FOR COATING A SUBSTRATE

(71) Applicant: Service Support Specialties, Inc, Montville, NJ (US)

(72) Inventors: Gary Hillman, Livingston, NJ (US); Victoria Rocha, Jackson, NJ (US)

(73) Assignee: Service Support Specialties, Inc

( * ) Notice: Subject to any disclaimer, the term of this patent is extended or adjusted under 35 U.S.C. 154(b) by 0 days.

(21) Appl. No.: 16/694,353

(22) Filed: Nov. 25, 2019

(65) Prior Publication Data

US 2020/0164402 A1 May 28, 2020

Related U.S. Application Data

(60) Provisional application No. 62/771,717, filed on Nov. 27, 2018.

(51) Int. Cl.
| | |
|---|---|
| *B05D 3/12* | (2006.01) |
| *B05D 1/00* | (2006.01) |
| *B05D 1/32* | (2006.01) |
| *B05D 3/02* | (2006.01) |
| *B05D 3/00* | (2006.01) |
| *H01L 21/67* | (2006.01) |

(Continued)

(52) U.S. Cl.
CPC .............. *B05D 1/005* (2013.01); *B05D 1/32* (2013.01); *B05D 3/007* (2013.01); *B05D 3/0272* (2013.01); *B05D 3/0426* (2013.01); *G03F 7/162* (2013.01); *H01L 21/6715* (2013.01)

(58) Field of Classification Search
CPC .......... B05D 1/005; B05D 1/32; B05D 3/007; B05D 3/0272; B05D 3/0426; H01L 21/6715; G03F 7/162

USPC ........................................................ 427/240
See application file for complete search history.

(56) References Cited

U.S. PATENT DOCUMENTS

| | | | |
|---|---|---|---|
| 6,090,209 | A | 7/2000 | Strodtbeck et al. |
| 6,391,523 | B1 | 5/2002 | Hurditch et al. |

(Continued)

FOREIGN PATENT DOCUMENTS

WO    WO-0017118 A1 *  3/2000  ............. B05D 1/005

OTHER PUBLICATIONS

Photolithography Overview for Mems, Southwest Center for Microsystems Education, The University of Mexico, 800 Bradbury Drive SE. Albuquerque, NM 87106-4346., https://nanoscale.unl.edu/pdf/Photolithography_Instructor_Guide.pdf Knowledge Probe (Pre-Quiz) pp. 1-42.

*Primary Examiner* — Kirsten Jolley
(74) *Attorney, Agent, or Firm* — The Belles Group, P.C.

(57) ABSTRACT

A method and/or system for coating a substrate with a coating material. The coating material may be a polymer such as a photoresist. The method involves dispensing a coating material onto a substrate during which a temperature differential between the coating material and the substrate is at least 5° C. This temperature differential may be achieved by cooling the substrate and/or heating the coating material prior to dispensing the coating material onto the substrate. Due to the temperature differential, as the coating material contacts the substrate the viscosity of the coating material will increase, assisting the coating material in adhering to the substrate. Then, when the substrate is spun, the coating material with the increased viscosity will remain adhered to the substrate thereby providing a more conformal coating.

20 Claims, 7 Drawing Sheets

(51) Int. Cl.
  *B05D 3/04* (2006.01)
  *G03F 7/16* (2006.01)

(56) References Cited

U.S. PATENT DOCUMENTS

| | | |
|---|---|---|
| 6,403,287 B1 | 6/2002 | Jung et al. |
| 7,235,336 B1 | 6/2007 | Gu |
| 8,906,452 B1 | 12/2014 | Hillman |
| 9,469,912 B2 | 10/2016 | Buckalew et al. |
| 2004/0048002 A1* | 3/2004 | Shifflette ............... B05D 1/02 427/430.1 |
| 2004/0072450 A1 | 4/2004 | Collins et al. |
| 2009/0011505 A1* | 1/2009 | Leunissen ............ A01N 1/0289 435/374 |
| 2016/0082453 A1* | 3/2016 | Mayr ...................... B05B 9/002 427/421.1 |

\* cited by examiner

METHOD AND/OR SYSTEM FOR COATING A SUBSTRATE

CROSS-REFERENCE TO RELATED APPLICATIONS

The present application claims priority to U.S. Provisional Patent Application Ser. No. 62/771,717, filed Nov. 27, 2018, the entirety of which is incorporated herein by reference.

BACKGROUND OF THE INVENTION

The process of spin coating polymers onto a substrate or wafer is widespread in the industry of microelectromechanical systems. There are two methods currently employed to achieve the coating of polymers on a substrate: a spin method and a spray method. In the spin method, substrates are treated by applying a quantity of polymer to the top side of the substrate while the bottom side is adhered by vacuum to a rotatable vacuum chuck. The wafer is spun at a relatively high speed and excess polymer is spun off the wafer leaving a relatively thin film of polymer on the top of the wafer. In the spray method, the polymer is sprayed onto the top surface of the substrate. Both of these methods are non-optimal, particularly when being used to coat a high topographical substrate having deep etchings. In particular, there tends to be difficulty in obtaining a coating having a satisfactory thickness on corners of the etchings. Thus, a need exists for an improved polymer coating method and system that achieves a more conformal coverage on the substrate.

SUMMARY OF THE INVENTION

The present invention is directed to a method and/or system for coating a substrate with a coating material. The coating material may be a polymer such as a photoresist. The method involves dispensing a coating material onto a substrate whereby a temperature differential between the coating material and the substrate is at least 5° C. This temperature differential may be achieved by cooling the substrate and/or heating the coating material prior to dispensing the coating material onto the substrate. Due to the chilled temperature of the substrate, as the coating material contacts the substrate the viscosity of the coating material will increase, assisting the coating material in adhering to the substrate. Then, when the substrate is spun, the coating material with the increased viscosity will remain adhered to the substrate thereby providing a more conformal coating as compared to previous coating processes.

In one aspect, the invention may be a method of coating a substrate with a coating material, the method comprising: positioning a substrate on a support member of a spin module; dispensing a coating material onto the substrate; and spinning the substrate with the spin module to coat the substrate with the coating material while removing excess amounts of the coating material from the substrate; and wherein during the dispensing of the coating material onto the substrate, the substrate is at a first temperature and the coating material is at a second temperature that is at least 5° C. greater than the first temperature.

In another aspect, the invention may be a method of coating a substrate with a coating material, the method comprising: chilling a substrate to a first temperature that is below ambient temperature; dispensing a coating material onto the substrate, a first portion of the coating material that is in surface contact with the substrate increasing in viscosity as it cools due to contact with the substrate; and spinning the substrate so that the first portion of the coating material remains on the substrate and a second portion of the coating material is removed from the substrate.

In yet another aspect, the invention may be a method of coating a substrate comprising: positioning a substrate on a support member of a spin module; blowing a cooling gas onto the substrate while spinning the substrate with the spin module; and dispensing acetone onto the substrate while continuing to blow the cooling gas onto the substrate to reduce a temperature of the substrate to at or below 10° C.

In a further aspect, the invention may be a system for coating a substrate comprising: a spin module comprising a support member for supporting a substrate; a chiller module configured to blow a cooling gas onto the substrate; a actuator mechanism operably coupled to the chiller module; a heating sub-system configured to heat a coating material and dispense the heated coating material onto the substrate; and a control unit operably coupled to the actuator mechanism to move the chiller module in opposite directions towards and away from the spin module.

BRIEF DESCRIPTION OF THE DRAWINGS

The present invention will become more fully understood from the detailed description and the accompanying drawings, wherein.

DETAILED DESCRIPTION OF THE INVENTION

The following description of the preferred embodiment(s) is merely exemplary in nature and is in no way intended to limit the invention, its application, or uses.

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the exemplified embodiments. Accordingly, the invention expressly should not be limited to such exemplary embodiments illustrating some possible non-limiting combination of features that may exist alone or in other combinations of features; the scope of the invention being defined by the claims appended hereto.

Figure 1:
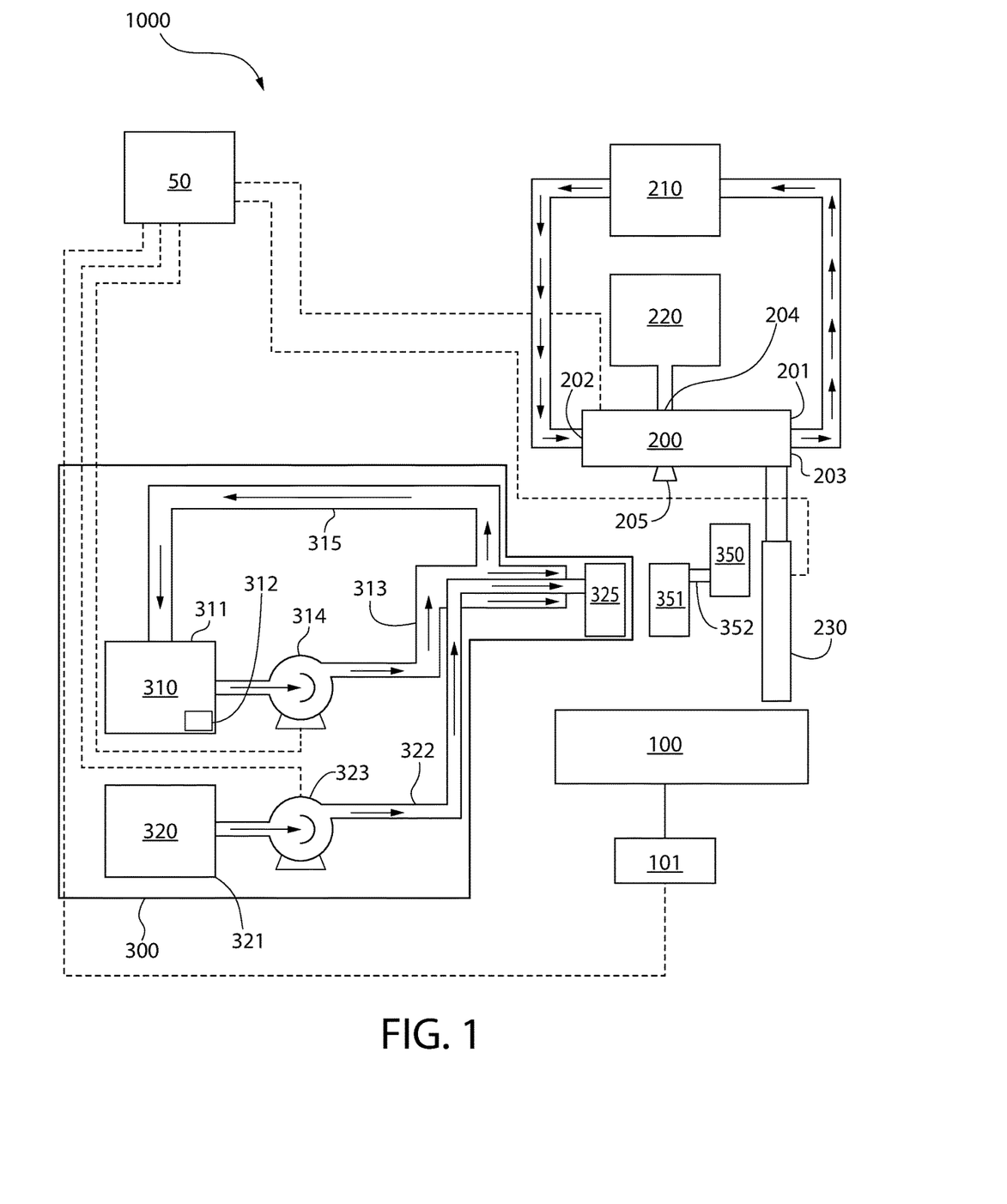
FIG. 1 is a schematic diagram of a system for coating a substrate in accordance with an embodiment of the present invention.

Referring first to FIG. 1, a system 1000 for coating a substrate with a coating material will be described. In some embodiments described herein, the coating material is a polymer, and more specifically a photoresist. In one particular embodiment, the coating material may be AZ® P4620 photoresist. However, in general the coating material can be any material that is used to coat a substrate in a microelectromechanical (MEMS) system. Substrates are generally coated with a polymer such as a photoresist for the photolithography and/or photoengraving processes to facilitate the formation of a patterned coating on the surface of the substrate. The coating material is generally a light-sensitive material that is partially covered by a patterned mask. The coating material is then subjected to light and the exposed portions of the coating material are degraded and dissolved away, leaving behind a coating only where the mask was placed. It can be important for the coating material to have a uniform thickness so that the coating material is conformal along an entirety of a substrate, particularly in regions that have been etched. The coating material is more conformal as compared to conventional coating techniques and processes.

As used herein, the term substrate is intended to refer to any flat article used in the MEMS or semiconductor industry. Thus, for example, the substrates described herein may be those that are used in the semiconductor industry and may be described herein as semiconductor wafers or simply wafers, raw silicon substrates, flat articles, panels, or the like. Typically, the substrate is a flat article used in the fabrication of an integrated circuit, although the invention is not to be so limited in all embodiments. Such substrates may be formed from a thin slice of a semiconductor material, such as a crystalline silicon.

The system 1000 comprises a spin module 100 that is configured to support and spin a substrate during a spin coating process as described herein. Thus, the invention described herein is an improvement to the spin coating processes typically used for coating a substrate with a coating material. The spin module 100 may comprise a vacuum chuck or other support member for supporting the substrate therein. The spin module 100, and more specifically the support member thereof, is operably coupled to a motor 101 so that the support member and the substrate supported thereby can be spun. The motor 101 may be operably coupled to a control unit 50 that controls operation of the motor either in response to user interaction with the control unit 50 or in response to instructions stored on the control unit 50 or in a memory device to which the control unit 50 is operably coupled.

In the exemplified embodiment, the system 1000 comprises a chiller module 200 and a heating sub-system 300 that operate during a process of coating a substrate with a coating material in accordance with the invention described herein. It should be appreciated that in some embodiments only one of the chiller module 200 or the heating sub-system 300 may operate during a coating process. Moreover, insofar as the invention described herein relates to a method, in some embodiments the process of chilling the substrate and/or heating the coating material may be achieved using other structures and components and in that regard the chiller module 200 and the heating sub-system 300 are merely exemplary.

Referring to the exemplified embodiment, the chiller module 200 comprises a chiller housing 201 having a chiller inlet 202 and a chiller outlet 203 that are both operably (or fluidly) coupled to a chilled fluid source 210. In the exemplified embodiment, there is a closed loop path between the chilled fluid source 210 and the housing 201 of the chiller module 200 such that a chilled fluid stored in the chilled fluid source 210 flows into the chiller housing 201 of the chiller module 200 via the chiller inlet 202, out of the chiller housing 201 through the chiller outlet 203, and back to the chilled fluid source 210.

The chilled fluid source 210 stores a chilled fluid. The chilled fluid source 210 may be a container or other vessel for storing the chilled fluid. The chilled fluid source 210 may comprise a cooling member that operates to cool the chilled fluid, or the chilled fluid may be chilled outside of the container and then later transported to the chilled fluid source 210 for storage and to maintain its chilled state. In some embodiments, the chilled fluid may be a solution of ethyl glycol and deionized water. In other embodiments, the chilled fluid may be chilled water. The chilled fluid may take on other forms as well and the invention is not to be particularly limited by the material or substance of the chilled fluid in all embodiments. The chilled fluid may flow through a serpentine or other curved passageway or channel within the chiller housing 210 to chill a cooling gas that is to be used to chill the substrate as described herein.

The chiller housing 201 also comprises a cooling gas inlet 204 and a cooling gas outlet 205. The cooling gas inlet 204 is operably (or fluidly) coupled to a cooling gas source 220 that stores a cooling gas. The cooling gas that is stored in the cooling gas source 220 may be nitrogen gas in some embodiments. In other embodiments, the cooling gas that is stored in the cooling gas source 220 may be clean dry air (CDA). However, the invention is not to be so limited and the cooling gas could carbon dioxide, helium, air or the like. It is preferable in some embodiments that the cooling gas be dry and free of liquid.

During use of the chiller module 200, the chilled fluid flows along/through the closed loop from the chilled fluid source 210 into the chiller housing 201 of the chiller module 200 and then back again to the chilled fluid source 210. At the same time, the cooling gas flows from the cooling gas source 220 into the chiller housing 201 through the cooling gas inlet 204 and then out of the chiller housing 201 through the cooling gas outlet 205. The cooling gas outlet 205 may comprise a plurality of openings through which the cooling gas can flow out of the chiller housing 201. Thus, the cooling gas outlet 205 may operate similar to a shower head. In one embodiment, the cooling gas outlet 205 may comprise 20-30 outlet openings through which the cooling gas can flow. Thus, the openings of the cooling gas outlet 205 may be arranged so that the cooling gas blows simultaneously over the entirety of the substrate during a chilling or cooling operation as described herein.

As the cooling gas flows through the chiller housing 201, the cooling gas loses heat and becomes cold due to the pumping of the chilled fluid through the chiller housing 201. In some embodiments, one or both of the chilled fluid and the cooling gas may flow along a serpentine path within the chiller housing 201 to increase the amount of time that the cooling gas is in contact with the chilled fluid before it is dispensed from the cooling gas outlet 205 to ensure that the cooling gas is chilled to the desired temperature before being dispensed. Regardless of the exact manner in which this is achieved, the cooling gas that flows out of the chiller housing 201 via the cooling gas outlet 205 is cold. In some embodiments the cooling gas that is dispensed from the cooling gas outlet 205 is below ambient temperature. In some embodiments the cooling gas that is dispensed from the cooling gas outlet 205 has a temperature that is below 20° C., or below 15° C., or below 10° C., or below 5° C.

As described further herein below, the chiller module 200 is preferably positioned so that the cooling gas flowing out of the cooling gas outlet 205 contacts the substrate in order to chill or cool the substrate before dispensing the coating material thereon during a coating process. Because the cooling gas has been cooled by the chilled fluid within the chiller housing 201 of the chiller module 200, the cooling gas that contacts the substrate functions to cool (chill or reduce the temperature of) the substrate. More specifically, in the exemplified embodiment the chiller module 200 is designed to cool the substrate using convection cooling.

In the exemplified embodiment, the chiller module 205 is operably coupled to an actuator mechanism 230. The actuator mechanism 230 may also be operably coupled to the control unit 50 as shown in FIG. 1. The actuator mechanism 230 is configured to move the chiller module 200 upwardly and downwardly in opposing directions towards and away from the spin module 100 during a coating procedure. Thus, for example, when the procedure/operation calls for cooling the substrate, the actuator mechanism 230 may move the chiller module 200 downwardly so that is closely adjacent to the substrate held on the spin module 100. In some embodiments, during the cooling operation the chiller module 200 may be spaced less than 10 mm, or more specifically less than 8 mm, or more specifically less than 6 mm, or more specifically less than 4 mm, or more specifically less than 2 mm away from the substrate.

After the substrate has been cooled to a desired temperature, the actuator mechanism 230 may move the chiller module 200 upwardly away from the substrate to perform other steps in the coating process. The actuator mechanism 230 may be a pneumatic actuator in some embodiments. The actuator mechanism 230 may comprise a piston that allows the chiller module 200 to move upwardly and downwardly as described herein. In some embodiments, the piston may be controlled by an air valve. The control unit 50 may store processing instructions or recipes that include instructions regarding when to move the chiller module 200 upwardly and downwardly as described herein. In other embodiments, this movement of the chiller module 200 may be achieved manually by a user or the initiation of such movement may be made by user manipulation or interaction with the control unit 50.

The heating sub-system 300 is a sub-system that is configured to heat a coating material (polymer, photoresist, or the like) and then dispense the heated coating material onto the substrate that is being supported by the spin module 100. In that regard, the heating sub-system 300 generally comprises a heated fluid source 310 and a coating material source 320. The heated fluid source 310 may comprise a container 311 holding a fluid and a heater 312 located within or positioned on the outside of the container 311 for heating the fluid contained in the container 311. The fluid may be any fluid that can be used to heat another fluid in a heat exchanger type apparatus, but in the exemplified embodiment the fluid in the container 311 of the heated fluid source 310 is water.

The heating sub-system 300 comprises an outer conduit 313 that is operably coupled to the heated fluid source 310. In the exemplified embodiment, there is a pump 314 located along the outer conduit 313 for pumping the fluid from the heated fluid source 310 to the outer conduit 313. A recirculation conduit 315 is operably and fluidly coupled to the outer conduit 313 to recirculate the fluid from the outer conduit 313 back to the container 311 so that the fluid can be re-heated and then made to flow back through the outer conduit 313. Thus, the heated fluid flows along a closed loop that comprises the container 311 of the heated fluid source 310, the outer conduit 313, and the recirculation conduit 315. The pump 314 could be omitted in some embodiments and there could instead be a valve or the like located along the outer conduit 313 for allowing and preventing flow of the heated fluid through the conduit 313.

The coating material source 320 comprises a container 321 that contains a coating material. As noted herein, the coating material may be a polymer such as a photoresist or any other material that is used in coating a substrate or semiconductor wafer. The heating sub-system 300 comprises an inner conduit 322 that is operably coupled to the coating material source 320. In the exemplified embodiment, there is a pump 323 located along the inner conduit 322 for pumping the coating material from the coating material source 320 to the inner conduit 322. Of course the pump 323 is not needed in all embodiments and there could instead be a valve located along the inner conduit 322 for allowing and preventing flow of the coating material therethrough.

A first end of the inner conduit 322 is fluidly coupled to the coating material source 320 and a second end of the inner conduit 322 is fluidly coupled to a dispenser 325. Thus, the coating material flows through the inner conduit 322 from the coating material source 320 to the dispenser 325. The dispenser 325 then dispenses the coating material onto the substrate when the substrate is being supported by the spin module 100 as described herein. In some embodiments, the dispenser 325 may comprise a dispense arm that moves laterally along the substrate as the substrate spins below on the spin module 100. Thus, the dispenser 325 may oscillate from edge to edge (of the substrate) to maximize the coverage of the substrate with the coating material. Of course, the invention is not to be so limited in all embodiments and the dispenser 325 may be stationary in other embodiments. The dispenser 325 may also be configured to move sufficiently far laterally so that it does not impede the upward and downward movement of the chiller module 200 described above during substrate chilling/cooling operations.

As shown in FIG. 1, for at least a portion of its length, the inner conduit 322 is located inside of the outer conduit 313. In some embodiments, the inner conduit 322 may be positioned inside of the outer conduit 313 for at least three feet, or more specifically at least four feet. As noted above, the fluid flowing through the outer conduit 313 is heated. In some embodiments, the fluid flowing through the outer conduit 313 may be heated to at least 30° C., or at least 35° C., or at least 40° C., or at least 45° C. In some embodiments, the fluid may be heated in the container 311 to a temperature of between 30° C. and 45° C., more specifically between 35° C. and 42° C., and still more specifically between 37° C. and 40° C.

Thus, as the heated fluid flows through the outer conduit 313 and the coating material flows through the portion of the inner conduit 322 that is positioned within the outer conduit 313, a heat exchange process takes place whereby the coating material is heated by the heated fluid. Thus, the portion of the heating sub-system 300 whereby the inner conduit 322 is located inside of the outer conduit 313 may form a sort of heat exchanger. Of course, the same system can be used to dispense the coating material without heating the coating material simply by operating the pump 323 but not the pump 314 so that the coating material flows through the inner conduit 322 to the dispenser 325 but the heated fluid does not flow through the outer conduit 313.

In some embodiments, the coating material flowing within the inner conduit 322 may be heated to within approximately five degrees of the temperature of the heated fluid in the container 311. Thus, the coating material may be heated to a temperature that is at least 25° C., or at least 30° C., or at least 35° C., or at least 40° C. In some embodiments, the coating material flowing within the inner conduit 322 may be heated to a temperature of between 25° C. and 40° C., more specifically between 30° C. and 37° C., and still more specifically between 32° C. and 35° C.

As noted above, the inner conduit 322 is fluidly coupled to the dispenser 325. However, the outer conduit 313 is not fluidly coupled to the dispenser 325. Thus, the heated fluid cannot flow to the dispenser 325 and cannot be dispensed onto the substrate. Rather, as the heated fluid reaches the end of the outer conduit 313, the heated fluid flows through the recirculation conduit 315 and back to the heated fluid source 310 for reheating so that it can once again be circulated through the outer conduit 313 and the recirculation conduit 315.

Finally, the exemplified embodiment also comprises a solvent source 350 that is operably coupled to a solvent dispenser 351. The solvent source 350 may be any type of container that contains a solvent. In the exemplified embodiment, the solvent stored in the solvent container may be acetone. The solvent dispenser 351 is configured to dispense the solvent onto the substrate that is supported by the spin module 100. Thus, the solvent dispenser 351 is positioned above the spin module 100 for this purpose. In some embodiments the dispenser 325 of the heating sub-system 300 may also be used for dispensing the solvent by fluidly coupling the solvent source 350 to the dispenser 325, thereby negating the need for a separate and distinct solvent dispenser 351. The solvent source 350 is operably coupled to the solvent dispenser 351 via a solvent conduit 352. A pump, valve or the like may also be positioned along the solvent conduit 352 in some embodiments for allowing and preventing flow of the solvent from the solvent source 350 to the solvent dispenser 351. In embodiments that utilize a pump or valve, the pump or valve may be operably coupled to the control unit 50 for automatic dispensing of the solvent from the solvent dispenser 351 in accordance with instructions pre-stored on the control unit 50 or a memory device to which the control unit 50 is operably coupled. The solvent source 350 and the solvent dispenser 351 could also be omitted in some embodiments as they may not be pertinent to the system 1000 and methods described herein in some embodiments.

The various conduits described herein may be tubes or lengths of tubing formed from polyethylene terephthalate (PET), polytetrafluoroethylene (PTFE), polyvinyl chloride (PVC), nylon, silicone, or the like. The conduits may be rigid or flexible as desired. Furthermore, the spin module 100 may have a lid, and the dispensers 325, 351 may extend through the lid or the spin module 100 may have an open top end through which the substrate is placed onto the support member thereof. The positioning of the various components of the system 1000 as shown in FIG. 1 is not limiting of the invention. Specifically, the chiller module 200 should be configured to move upwardly and downwardly as described herein, and as the system 1000 is depicted the dispensers 325, 351 would impede such movement. The components would be positioned in a location that facilitates the function and operation as described throughout this document. Moreover, as mentioned above the dispensers 325, 351 may be configured to move, either automatically or manually by a user, so that they do not impede the movement of the chiller module 200 during substrate chilling operations. The dispensers 325, 351 can then be moved back into position when it is desired to dispense either the coating material or the solvent/acetone onto the substrate.

Figure 2:
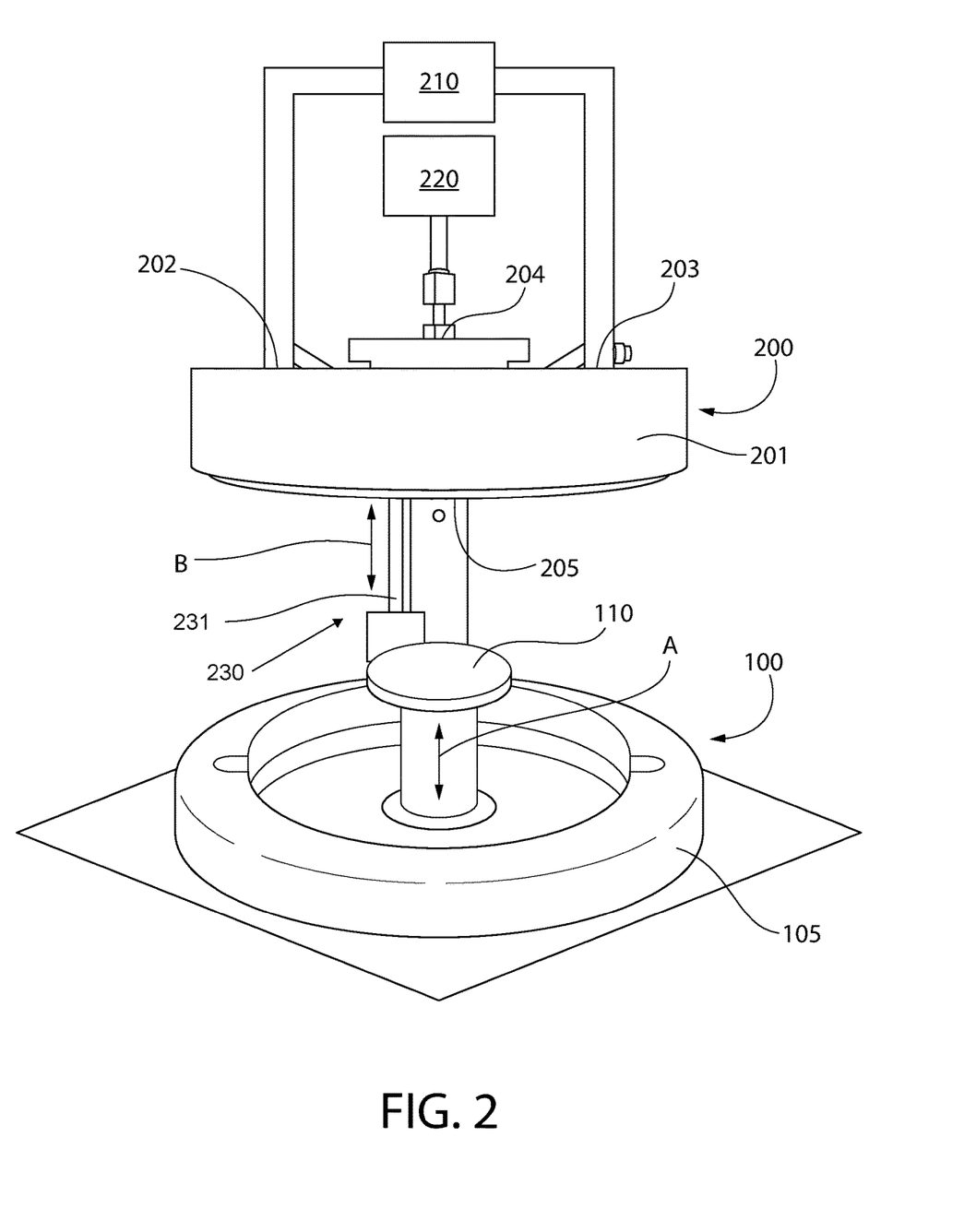
FIG. 2 is a is a perspective view of a spin module and a chiller module of the system of FIG. 1, with arrows illustrating the movement of the chiller module and a support member of the spin module.

Referring to FIG. 2, a perspective view of the spin module 100 and the chiller module 200 of the system 1000 are described. In this view, the heating sub-system 300 is not depicted. However, it should be appreciated that the dispenser 325 of the heating sub-system 300 would be positioned at a location that allows for the coating material dispensed therefrom to be dispensed onto the substrate that is supported by a support member 110 of the spin module 100. Similarly, the solvent dispenser 351 will also be positioned at a location that allows for the solvent to be dispensed onto the substrate. The invention is not to be particularly limited by the specific position of the various components so long as they are configured to operate in the manner described herein.

The spin module 100 generally comprises a bowl 105 and a support member 110. The support member 110 is the portion of the spin module 100 that is configured to hold a substrate during processing, such as during spin coating as described herein. The support member (or chuck) 110 may be configured to hold the substrate thereon using vacuum suction in some embodiments, although other techniques may also be used including adhesion, mechanical fasteners, mechanical fit, or the like. As shown using the arrow A in FIG. 2, the support member 110 may be movable upwardly and downwardly. Thus, the support member 110 may be configured to support or hold a substrate in an elevated position (which is what is shown in FIG. 2) and in a lowered position, whereby the support member 110 is lowered towards the bowl 105. When material is being dispensed onto the substrate, it is desirable that the substrate be in the lowered position so that material that is spun off of the substrate during spinning will splatter into the bowl 105.

The support member 110 may be formed from or coated with a material with a high specific heat. In one embodiment, the support member 110 may be formed from plastic and coated with aluminum. However, other materials may be used. The support member 110 is formed from or coated with a material having a high specific heat so that the support member 110 can help to maintain the substrate at a desired temperature. Thus, for example, if the substrate is chilled during the coating process, the support member 110 should be formed of a material that helps to maintain the substrate at the chilled temperature. In some embodiments, the system 1000 may include a forced cooling system configured to forcibly cool the support member 110. For example, a chiller module that is similar to the chiller module 200 could be positioned beneath or otherwise adjacent to the support member 110 to chill the support member. In this way, the support member 110 will help to maintain the substrate at the desired temperature as described herein even as the coating material is being dispensed onto the substrate.

Also shown in FIG. 2 is the chiller module 200. As noted previously, the chilled fluid source 210 and the cooling gas source 220 are both operably and fluidly coupled to the housing 201 of the chiller module 200. As the chilled fluid and the cooling gas flow through the housing 201, the cooling gas is cooled, and then the cooled cooling gas is blown through the cooling gas outlet 205 onto the substrate below.

As noted above, the chiller module 200 is operably coupled to an actuator mechanism 230 which can facilitate upward and downward movement of the chiller module 200 as shown with the arrow B. In the exemplified embodiment, the actuator mechanism 230 is a pneumatic actuator that includes a piston 231 that can move upwardly and downwardly in order to move the chiller module 200. The piston 231 may be controlled by an air valve in some embodiments. The piston 231 may be coupled to the chiller housing 201 and the chiller housing 201 may also be coupled to a rail to guide the chiller module 200 in its upward/downward movement. Of course, other techniques for achieving the desired up/down movement of the chiller module 200 could be used in other embodiments. For example, the chiller module 200 could be located on a track and could include a motor to initiate the movement. Moreover, in still other embodiments it may be possible to omit the actuator mechanism 230 because such movement may not be required. The movement enables the chiller module 200 to be positioned closer to the substrate during cooling operations, but such close positioning may not be needed in all embodiments to achieve the desired cooling of the substrate.

Figure 6:
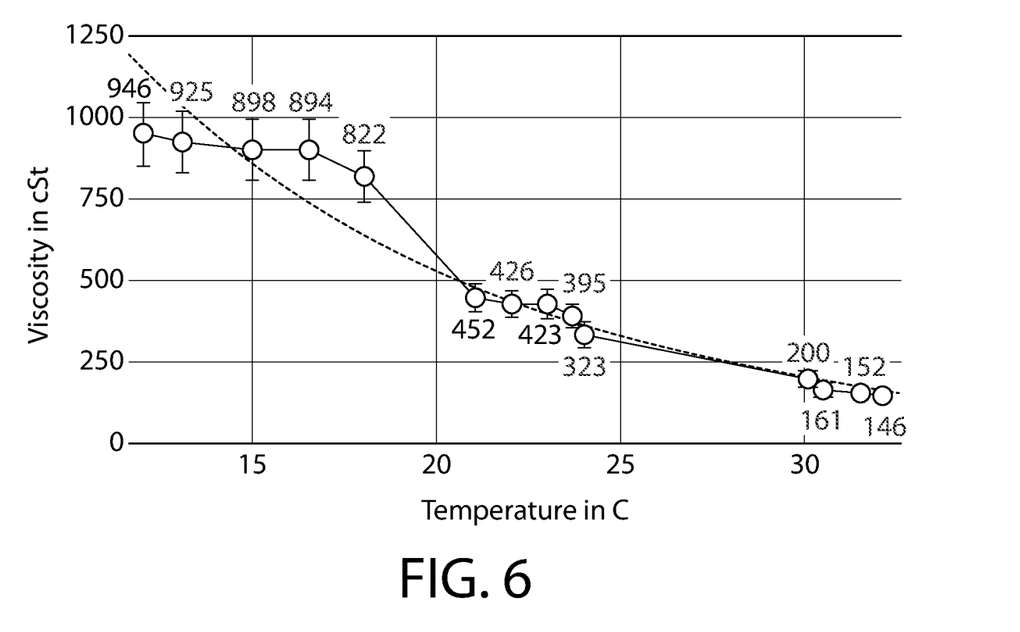
FIG. 6 is a graph of the viscosity of a coating material vs. the temperature of the coating material.

As mentioned previously, in the exemplified embodiment the substrate is chilled and the coating material is heated prior to dispensing the coating material onto the substrate. The reason for this has to do with viscosity and the ability of the coating material to remain adhered on the substrate. Specifically, the viscosity of the coating material decreases with an increase in temperature. Thus, by heating the coating material, its viscosity decreases and the coating material becomes more flowable (i.e., it has less internal friction). FIG. 6 is a graph illustrating the viscosity of a coating material versus the temperature of the coating material. As can be seen, as the coating material becomes hotter, its viscosity decreases. Stated another way, viscosity and temperature have an exponentially inverse relationship as they relate to the coating material.

That said, when the coating material is dispensed in accordance with embodiments of the invention described herein, it is heated to a temperature that is above ambient temperature. Furthermore, the substrate onto which the coating material is to be dispensed is cooled to a temperature that is below ambient. As a result, as the coating material contacts the substrate, the coating material cools rapidly and as a result becomes more viscous. That is, the portions of the coating material that are in contact with the cold substrate increase in viscosity so that those portions of the coating material stick to the substrate. This process has been found to result in a very uniform coating of the coating material on the substrate.

Although the invention has been described wherein the substrate is chilled to below ambient and the coating material is heated to above ambient, this is not required in all embodiments. Rather, in some embodiments it is the temperature differential between the coating material and the substrate at the time that the coating material is dispensed onto the substrate that is pertinent. Thus, in some embodiments the substrate may be chilled and the coating material may be dispensed without heating. In some embodiments the substrate and the coating material may both be chilled, but the substrate may be chilled to a lower temperature than the coating material. In still other embodiments the coating material may be heated and then dispensed onto the substrate which is at ambient temperature. In other embodiments the coating material and the substrate may both be heated, with the coating material being heated to a higher temperature than the coating material. In all embodiments, the coating material has a higher temperature than the substrate so that it becomes more viscous as it contacts the substrate. In some embodiments, the temperature differential between the coating material and the substrate as the coating material is dispensed onto the substrate may be at least 5° C. In other embodiments, the temperature differential between the coating material and the substrate may be at least 10° C. In still other embodiments, the temperature differential between the coating material and the substrate may be at least 15° C. In in still other embodiments the temperature differential between the coating material and the substrate may be at least 20° C.

Figure 7:
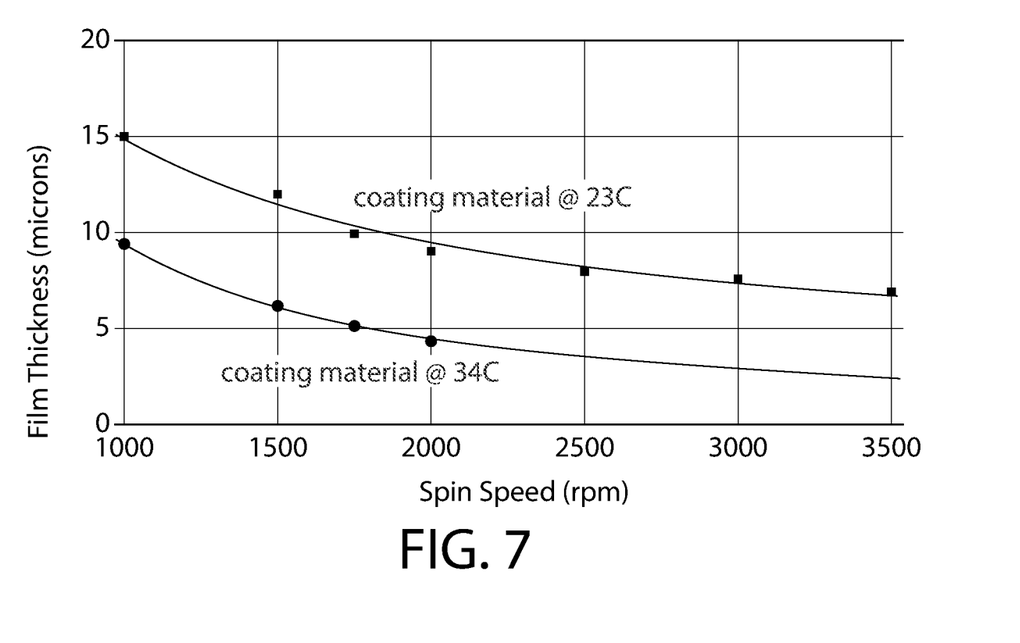
FIG. 7 is a graph of the film thickness of a coating material vs. a spin speed with the coating material at room temperature and a heated temperature.

FIG. 7 is a graphical representation of the film thickness of the coating material versus the spin speed of the substrate. There are two line curves on this graph. The top curve represents the film thickness at various spin speeds for a coating material that is held at a temperature of about 23° C. The bottom curve represents the film thickness at various spin speeds for a coating material that is held at a temperature of about 34° C. As noted above, the coating material has a greater viscosity at lower temperatures. For this reason, when the coating material is held at 23° C., it forms a film of greater thickness than when the coating material is held at 34° C. (when the spin speeds are the same).

In spin coating, more coating material than is needed or wanted is dispensed onto the substrate. Excess amounts of the coating material are spun off of the substrate as the substrate is spun by the spin module 100. By heating the coating material and then dispensing it onto a chilled substrate (or otherwise creating a temperature differential between the coating material and the substrate prior to dispensing the coating material onto the substrate), the spin-off of the coating material can be altered dependent on whether the coating material is in direct contact with the substrate (and hence colder) or not in direct contact with the substrate (and hence warmer). The coating material that is in direct contact with the substrate will have a slower spin-off speed because it is cooler and more viscous and therefore less easily flows off the substrate whereas the coating material that is not in direct contact with the substrate will have a greater spin-off speed because it is warmer and less viscous and therefore more easily flows off the substrate.

Figure 3:
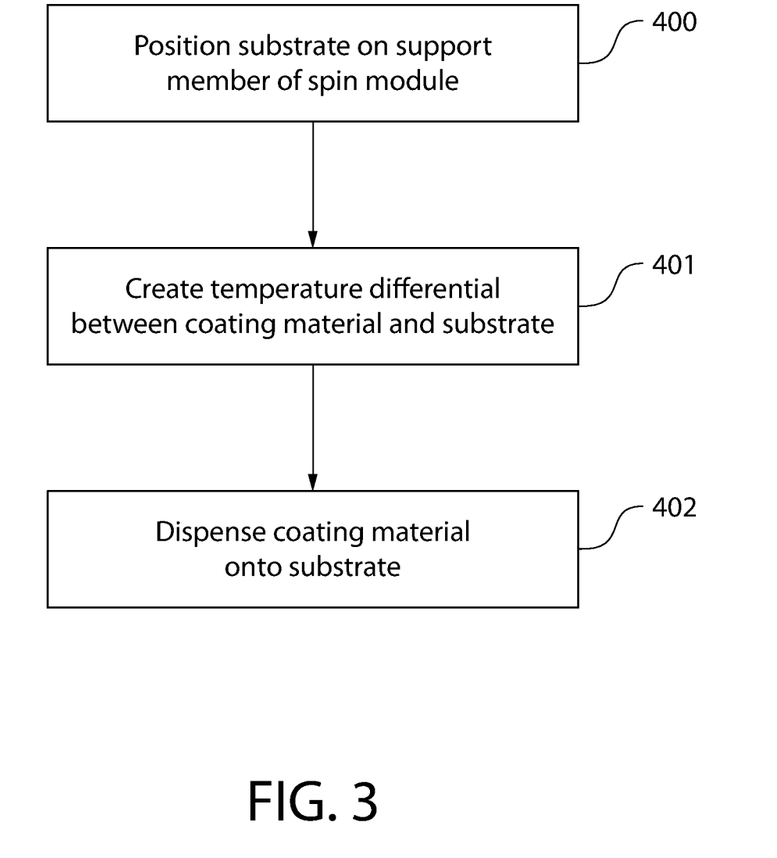
FIG. 3 is a flowchart for a method of coating a substrate in accordance with an embodiment of the present invention.

Referring to FIG. 3, a method of coating a substrate will be described in accordance with an embodiment of the present invention. In accordance with an exemplary embodiment, the first step 400 is to position the substrate on the support member of the spin module. The second step 401 is to create a temperature differential between the coating material and the substrate. The third step 402 is to dispense a coating material onto the substrate. As discussed herein, the temperature differential between the coating material and the substrate can be achieved in several different ways. These include cooling the substrate only, cooling the substrate and the coating material with the substrate being cooled to a lower temperature than the coating material, heating the coating material only, or heating the substrate and the coating material with the coating material being heated to a higher temperature than the coating material. In some embodiments, the temperature differential between the coating material and the substrate may at least 5° C., with the coating material having a greater temperature than the substrate. In other embodiments, the temperature differential between the coating material and the substrate may be at least 10° C., or at least 15° C., or at least 20° C., or at least 25° C., or at least 30° C., with the coating material having a greater temperature than the substrate in all embodiments. In some embodiments the temperature differential may be in a range of 10° C. to 30° C.

Thus, in accordance with the method described with reference to FIG. 3, during the dispensing of the coating material onto the substrate, the substrate is at a temperature that is at least 5° C. (or at least 10° C., or at least 15° C., or at least 20° C., or at least 25° C., or at least 30° C.) less than the temperature of the coating material. Thus, the coating material will have an increase in viscosity upon impact with the substrate during the dispensing as the coating material temperature decreases due to such contact with the substrate. This will facilitate an adherence of the coating material to the substrate. The substrate can be spun by the spin module during and/or after the dispensing of the coating material onto the substrate so that excess amounts of the coating material can be spun off of the substrate. This will leave a film of the coating material on the substrate having a desired thickness.

Figure 4:
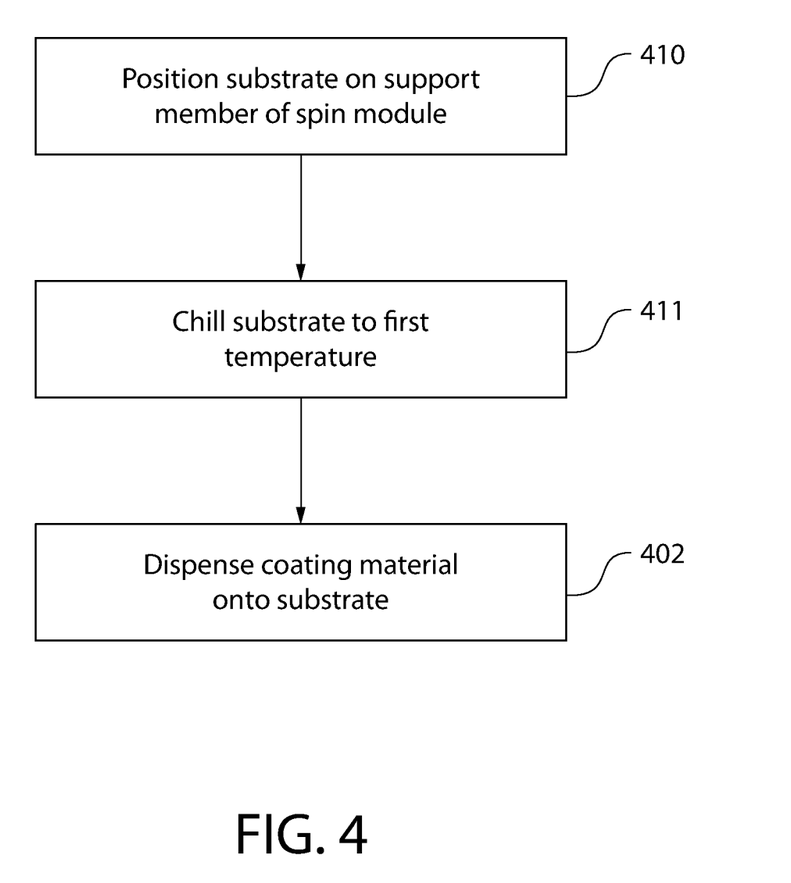
FIG. 4 is a flowchart for a method of coating a substrate in accordance with another embodiment of the present invention.

Referring to FIG. 4, a method of coating a substrate will be described in accordance with another embodiment of the invention described herein. In accordance with this embodiment, the first step 410 is to position the substrate on the support member of the spin module. In the second step 411, the substrate is chilled to a first temperature. In the exemplified embodiment, the first temperature is a sub-ambient temperature. In that regard, as used herein ambient temperature refers to a conventional room temperature, such as being in a range of 20° C. to 25° C. Thus, the first temperature may in some embodiments be a temperature that is below 20° C., or below 15° C., or below 10° C., or below 5° C. The first temperature may be in a range of negative 10° C. to 15° C., or negative 10° C. to 10° C., or 0° C. to 10° C., or 3° C. to 10° C., or 3° C. to 7° C., or approximately 5° C. in various different embodiments. In some embodiments, it may be desirable to ensure that the substrate is not chilled below the dew point of the ambient gas (i.e., the cooling gas) to ensure that the substrate remains dry.

Next, in the third step 402, a coating material is dispensed onto the previously chilled substrate. In some embodiments, the coating material may be heated to a second temperature prior to dispensing the coating material onto the substrate. In such embodiments, the second temperature may be at a temperature that is greater than the ambient temperature. Thus, the second temperature may be greater than 25° C., or greater than 30° C., or greater than 35° C., or greater than 40° C. in various different embodiments. In some embodiments, the second temperature may be in a range of 30° C. and 45° C., and more specifically in a range of 32° C. and 40° C., or in a range of 32° C. and 37° C. As with the embodiment of FIG. 3, this results in a temperature differential between the substrate and the coating material as the coating material is dispensed onto the substrate. This temperature differential may exist regardless of whether the coating material is heated. Thus, in some embodiments the substrate may be chilled as described herein and the coating material may be dispensed onto the substrate at ambient temperature. In such variation, a temperature differential still exists between the substrate and the coating material due to the chilling of the substrate In some embodiments, the first temperature may be below 10° C. and the second temperature may be at or above 30° C. In some embodiments, the first temperature may be at or below 5° C. and the second temperature may be at or above 35° C. In some embodiments, a difference between the first temperature of the chilled substrate and the second temperature of the heated coating material at the moment that the coating material is dispensed onto the substrate may be in a range of 5° C. to 50° C., or in a range of 15° C. to 50° C., or in a range of 20° C. to 50° C., or more specifically a range of 20° C. to 40° C. With this temperature differential, as the coating material contacts the substrate, the portions of the coating material that are in contact with the substrate will quickly cool, thereby becoming more viscous and staying in place even as the substrate may be rotated rapidly by the spin module 100.

Although described herein whereby the substrate is chilled to a sub-ambient temperature and the coating material is heated to a temperature that is above ambient temperature at the time that the coating material is dispensed onto the substrate, as noted herein, in other embodiments the coating material may not be heated. Specifically, in some embodiments the substrate may be chilled as described herein and the coating material that is dispensed onto the substrate may be at ambient temperature at the time of its dispensing. In this variation, the portions of the coating material that contact the substrate will still cool as they contact the chilled substrate relative to other portions of the coating material that are not in direct contact with the substrate. Thus, under such a modified process the portions of the coating material that are in direct contact with the substrate will increase in viscosity and stay in place on the substrate while the rest of the coating material will be less viscous and will be spun across the substrate and removed when the substrate is spun by the spin module 100.

Figure 5:
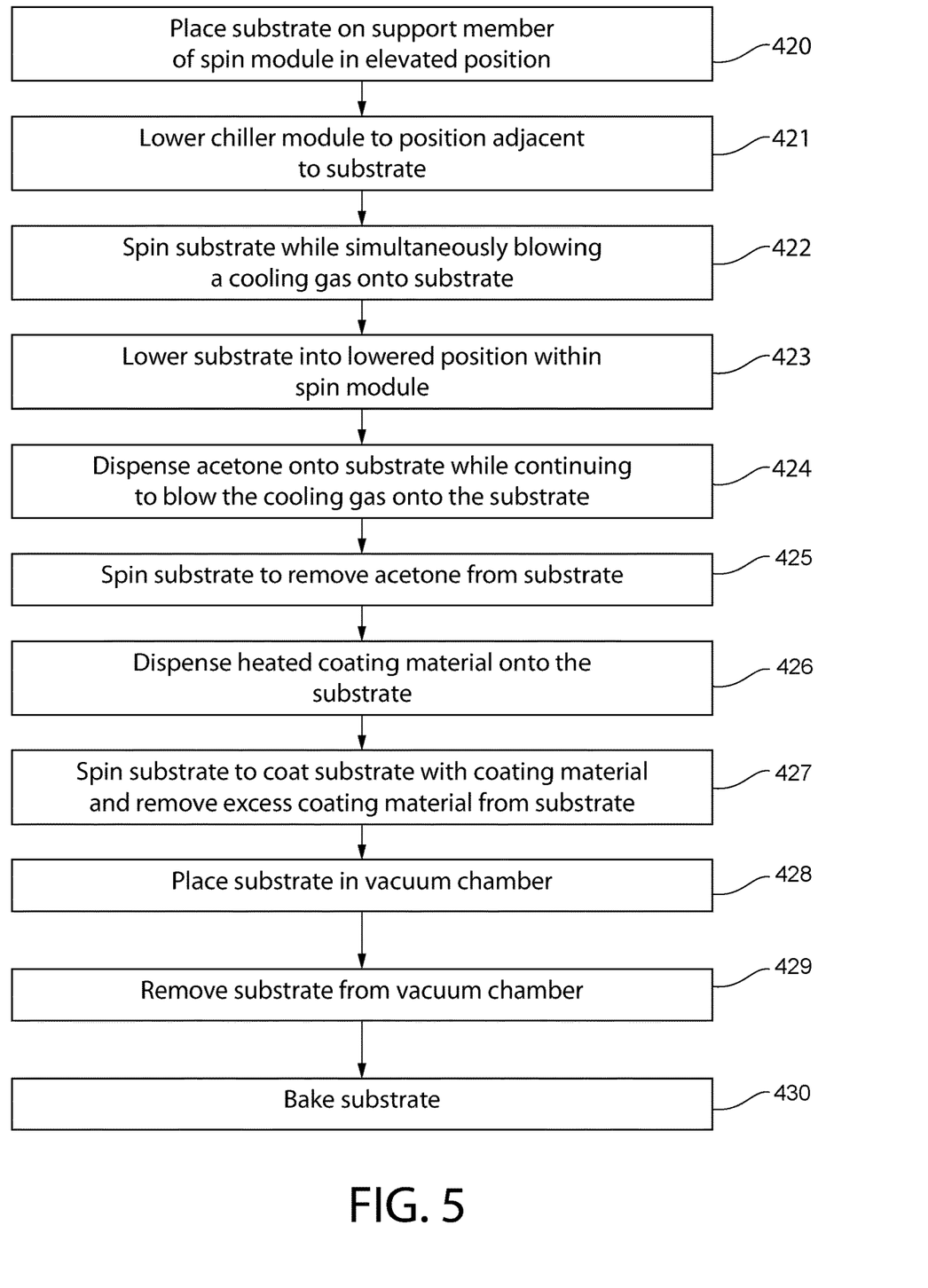
FIG. 5 is a flowchart for a method of coating a substrate in accordance with yet another embodiment of the present invention.

Referring now to FIGS. 1, 2, and 5 concurrently, a method of coating a substrate will be described in accordance with another embodiment of the invention. More specifically, more steps are provided in FIG. 5 to provide a more detailed explanation of the processes that are taking place to create the temperature differential between the coating material and the substrate in accordance with a specific implementation thereof. Specifically, in the method of FIG. 5 the substrate is chilled and the coating material is heated prior to dispensing the heating material onto the substrate.

The first step 420 is to place the substrate on the support member 110 of the spin module 100 with the support member in an elevated position (the support member 110 is in the elevated position in FIG. 2). As noted above, in the elevated position the substrate is supported above the bowl 105. The support member 110 may be put into the elevated position in some embodiments so that the substrate is located closer to the chiller module 200 during the chilling operations. Next, in step 421, the chiller module 200 is lowered by the actuator mechanism 230 so that the cooling gas outlet 205 is located adjacent to the substrate. In some embodiments, the cooling gas outlet 205 may be positioned at a distance of no more than 10 mm, or no more than 8 mm, or no more than 6 mm, or no more than 4 mm, or no more than 2 mm away from the substrate when in the lowered position. However, the exact distance between the chiller module 200 and the support member 110 (and substrate positioned thereon) is not to be limiting of the present invention in all embodiments. In some embodiments, the chiller module 200 and/or the support member 110 may be stationary rather than movable while still achieving the chilling operations described herein. However, the movement of the chiller module 200 and the support member 110 allows for the chiller module 200 to be positioned closer to the substrate while blowing the cooling gas onto the substrate Next, at step 422, the substrate is spun by the spin module 100 while the cooling gas is blown onto the substrate. In some embodiments, during step 422 the substrate may be spun for approximately 30 seconds at a rotational velocity of 10 rotations per minute (RPM). Of course, the substrate may be spun faster or slower than this in other embodiments. Furthermore, step 422 may take place for more or less than 30 seconds in some embodiments. For example, in some embodiments step 422 may take place for between 20 seconds and 40 seconds and spun at a velocity of between 5 RPM and 100 RPM. By spinning/rotating the substrate while the cooling gas is blown onto the substrate, the substrate may be chilled evenly.

Next, at step 423, the substrate is lowered into the lower position within the spin module 100. This may be achieved by lowering the support member 110 of the spin module 100 into the lowered position. In this position, the top surface of the substrate is preferably positioned at or below the top of the spin module 100 so that substances dispensed onto the substrate (i.e., the coating material and/or acetone as described herein) can be spun off into the bowl as the substrate is spun by the spin module 100. The cooling gas may continue to be blown onto the substrate as the substrate is lowered into the lowered position, although this is not required in all embodiments.

Next, at step 424, a solvent such as acetone is dispensed onto the substrate. The acetone may be dispensed onto the substrate for a period of time of 10 to 30 seconds, or more specifically 15 to 25 seconds, or more specifically approximately 20 seconds. However, the invention is not to be limited to this time period in all embodiments. In some embodiments, the cooling gas may be blown onto the substrate as the acetone is dispensed onto the substrate. In other embodiments, the cooling gas may be blown onto the substrate as soon as the acetone is no longer being dispensed onto the substrate.

At step 425, the substrate is spun by the spin module to spin off and evaporate the acetone. In some embodiments the cooling gas may continue to be blown onto the substrate as the substrate spins during step 425, although this is not required in all embodiments. Once the acetone has been spun off and evaporated and otherwise removed from the substrate, the substrate will be at a first temperature that is below ambient temperature, the first temperature being at or below 10° C. or in any of the temperature ranges provided above for the substrate.

Next, at step 426, the coating material may be dispensed onto the substrate. In some embodiments, the coating material is dispensed onto the substrate promptly upon the substrate reaching the desired temperature. For example, in some embodiments the coating material is dispensed onto the substrate no more than 10 seconds, or no more than 5 seconds, after the substrate reaches the first temperature and the cooling gas stops being blown onto the substrate. As has been described herein, the coating material may be heated to a second temperature that is above ambient temperature before being dispensed onto the substrate in some embodiments. For example, the coating material may be heated to a second temperature that is in a range of 30° C. and 45° C., and more specifically 32° C. and 40° C., prior to dispensing the coating material onto the substrate.

Due to the temperature differential between the substrate (which is at or below 10° C., for example) and the coating material (which is at or above 25° C. or at or above 30° C., for example), as the coating material contacts the substrate the viscosity of the coating material will decrease, thereby adhering the coating material to the substrate. Specifically, a first portion of the coating material that is in surface contact with the substrate will increase in viscosity as it cools due to contact with the substrate. A second portion of the coating material that is not in surface contact with the substrate will have a lower viscosity than the first portion of the coating material. Essentially, the further from the substrate, the warmer the coating material and the lower its viscosity.

Next, at step 427, the substrate is once again spun by the spin module. In some embodiments, the substrate may be spun by the spin module while the coating material is being dispensed onto the substrate. In other embodiments, the coating material may first be dispensed onto the substrate and then after completion of the dispensing, the substrate may be spun. By spinning the substrate, the first portion of the coating material will remain on the substrate to coat the substrate and the second portion of the substrate, which is excess, will be spun off of the substrate. Because the viscosity of the coating material that is in contact with and otherwise closest to the surface of the substrate has increased due to cooling, a sufficient amount of the coating material will remain on the substrate to ensure a uniform and adequate thickness film of the coating material remains on the substrate. The thicker and more viscous portions of the coating material will be less inclined to spin off of the substrate as the substrate spins, which will assist in maintaining an adequately thick layer or film of the coating material on the substrate.

In some embodiments, the substrate may be spun at a velocity of between 400 and 600 rpm, and more specifically approximately 500 rpm. This may take place while the coating material is being dispensed onto the substrate, with the dispenser moving or oscillating from edge to edge of the substrate to ensure maximum coverage. After dispensing is complete, the velocity at which the substrate is spun may be increased to between 1000 and 2000 rpm (the spin-off speed) for between 5 and 20 seconds, more specifically between 5 and 10 seconds. The spin-off speed is a large contributor to the film thickness desired and thus adjusting the spin-off speed may adjust the film thickness that remains on the substrate.

Next, the substrate is removed from the spin module. In some embodiments, after the coating process is complete the substrate is immediately made to stop spinning and removed from the spin module.

Next, at step 428, the substrate is placed in a vacuum chamber to solidify the coating material by removing solvents therein through evaporation. The vacuum chamber may be used in some embodiments to remove the solvent without harming the coating integrity. Specifically, the vacuum chamber is used instead of an oven, at least initially, because an oven would heat the coating material and again modify its viscosity. In the invention described herein, there is a desire to keep the viscosity of the coating material high so that it remains adhered on the substrate. Thus, the vacuum chamber allows for the evaporation of some of the solvents without degrading the integrity of the coating material. In some embodiments, the substrate may be kept in the vacuum chamber for approximately five minute. During that time period, somewhere between 10% and 20%, and more specifically 10%-14%, and still more specifically approximately 12% of the weight may be removed from the substrate by evaporation.

Next, at step 429, the substrate is removed from the vacuum chamber.

Finally, at step 430, the substrate is placed in an oven and baked to remove more of the solvent from the substrate without damaging the coating with the heat. In some embodiments, the oven may be heated to a temperature between 50° C. and 120° C., more specifically between 50° C. and 80° C., still more specifically between 60° C. and 75° C., and still more specifically between 65° C. and 70° C. The substrate may be placed in the oven for between 3 minutes and 7 minutes, and more specifically approximately five minutes. In other embodiments, the oven may be heated to a temperature of between 100° C. and 120° C. and the substrate may be placed in the oven for between 20 and 40 seconds, and more specifically approximately 30 seconds.

Figure 8:
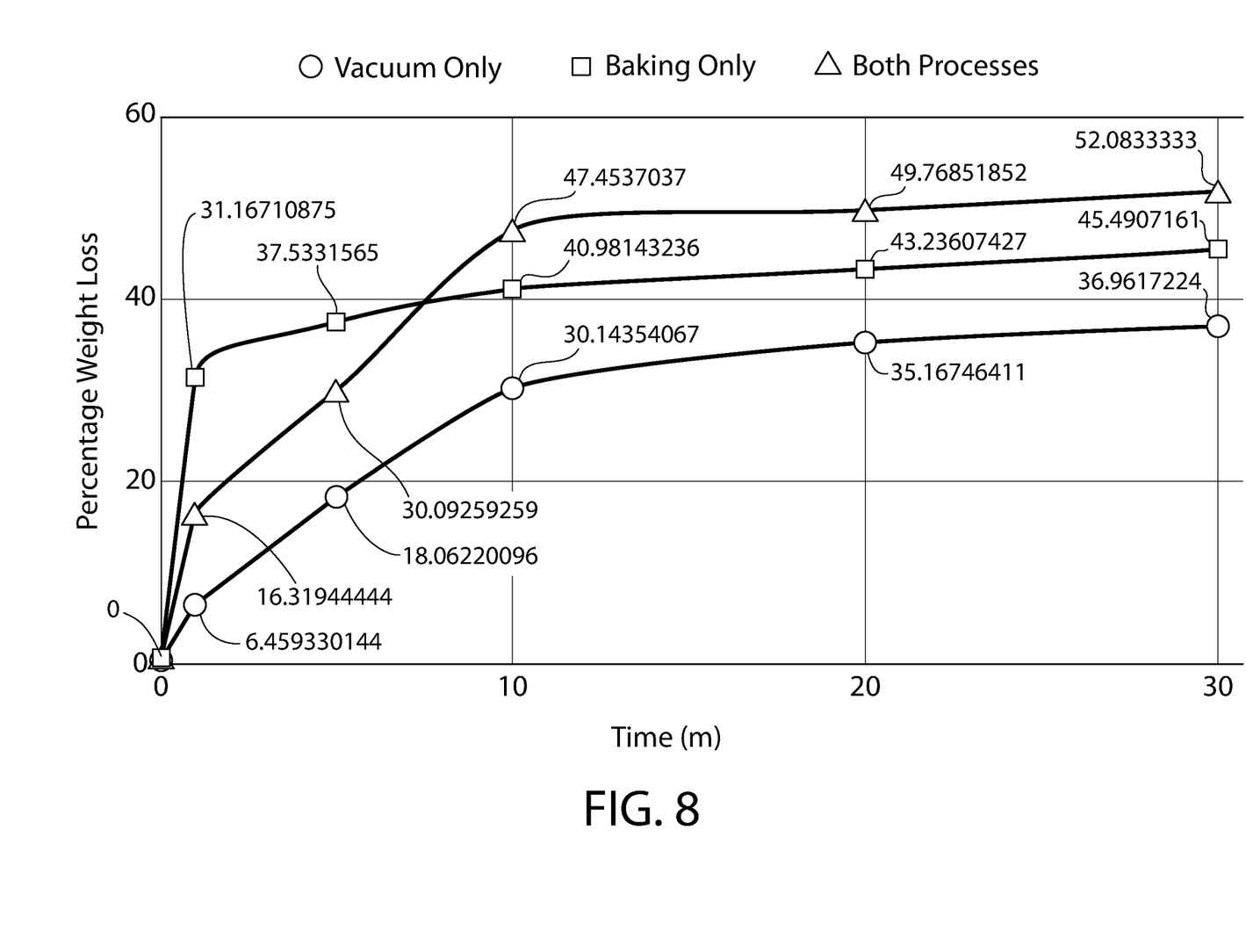
FIG. 8 is a graph of the percentage of weight loss for a coated substrate using different end processes.

The hot bake process for a short amount of time performs the removal of solvent without damaging the coating material with the heat. In some embodiments, the vacuum and bake processes may result in a total of 30-40%, or more specifically approximately 35% weight loss from the substrate, further solidifying the coating material. FIG. 8 is a graph illustrating the percentage of weight loss when using the vacuum and/or bake processes. As seen, using both the vacuum and baking processes together shows a significant weight loss, which can be interpreted that the weight lost from the processes is the solvent evaporation. In some embodiments, after the vacuum and bake processes, no further developing of the coating material (i.e., photoresist) may be needed.

In some embodiments, the substrate may be subjected to a pre-coating preparation before the substrate is chilled and/or the coating material is dispensed onto the substrate. For example, in some embodiments the substrate may be etched with potassium hydroxide to create a topographical surface. In some embodiments, the etched substrate may have isotropic and anisotropic geometries ranging from 200 µm to 600 µm from the highest point of the etching to the lower point of the etching. However, substrates with smaller or larger etched cavities/vias may also benefit from the methods described herein.

The substrate may then be coated with silicone dioxide or silicon nitride, which provides a first masking layer on the substrate. After the coating of the first masking layer, a metal may be sputtered into the cavity to create a second masking layer. The metal may be chrome in some embodiments. After the first and second masking layers are applied, the coating method described herein may be applied to create a uniform coating of the coating material across the cavities and edges formed during the etching process. In such embodiments, the metal (e.g., chrome) layer allows the coating material to adhere in a thicker film around the corners to enhance the results of the coating method described herein. In some embodiments, the pre-coating preparation may include coating the substrate with a metal such as chrome to form a mask layer but may not also require the first masking layer formed from silicon dioxide or silicon nitride.

While the invention has been described with respect to specific examples including presently preferred modes of carrying out the invention, those skilled in the art will appreciate that there are numerous variations and permutations of the above described systems and techniques. It is to be understood that other embodiments may be utilized, and structural and functional modifications may be made without departing from the scope of the present invention. Thus, the spirit and scope of the invention should be construed broadly as set forth in the appended claims.

What is claimed is:

1. A method of coating a substrate with a coating material, the method comprising:
    a) positioning a substrate on a support member of a spin module;
    b) dispensing a coating material onto the substrate; and
    c) spinning the substrate with the spin module to coat the substrate with the coating material while removing excess amounts of the coating material from the substrate;
    wherein during step b) the substrate is at a first temperature and the coating material is at a second temperature that is at least 5° C. greater than the first temperature; and
    wherein the first temperature is below ambient temperature and the second temperature is above ambient temperature.

2. The method according to claim 1 wherein the first temperature is 10° C. or less.

3. The method according to claim 2 wherein the first temperature is between 3° C. and 10° C.

4. The method according to claim 1 wherein the second temperature is at least 30° C.

5. The method according to claim 1 further comprising, prior to step b), chilling the substrate to the first temperature.

6. The method according to claim 5 wherein chilling the substrate to the first temperature comprises:
    blowing a cooling gas onto the substrate while spinning the substrate with the spin module;
    dispensing acetone onto the substrate while continuing to blow the cooling gas onto the substrate; and
    removing the acetone from the substrate, thereby reducing the first temperature to 10° C. or less.

7. The method according to claim 6 further comprising:
    wherein step a) comprises positioning the substrate on the support member of the spin module in an elevated position;
    wherein chilling the substrate to the first temperature further comprises:
        positioning a chiller module adjacent to the substrate while the substrate is positioned on the support member of the spin module in the elevated position;
        blowing the cooling gas from the chiller module onto the substrate while the substrate is spun by the spin module, wherein the cooling gas is clean dry air or nitrogen gas;
        lowering the substrate from the elevated position to a lowered position within the spin module; and
        dispensing the acetone onto the substrate while the substrate is in the lowered position while continuing to blow the cooling gas onto the substrate.

8. The method according to claim 1 wherein the coating material is heated to the second temperature in a heating sub-system prior to being dispensed onto the substrate.

9. The method according to claim 1 further comprising:
    d) removing the substrate from the spin module;
    e) placing the substrate in a vacuum chamber to solidify the coating material by removing a solvent thereof by evaporation;
    f) removing the substrate from the vacuum chamber; and
    g) baking the substrate to remove more of the solvent from the substrate.

10. The method according to claim 1 further comprising, prior to step b), chilling the substrate to the first temperature by blowing a cooling gas onto the substrate while spinning the substrate with the spin module.

11. The method according to claim 1 wherein a viscosity of the coating material increases upon the coating material contacting the substrate.

12. A method of coating a substrate with a coating material, the method comprising:
 a) chilling a substrate to a first temperature that is below ambient temperature;
 b) dispensing a coating material onto the substrate, a first portion of the coating material that is in contact with the substrate increasing in viscosity while remaining flowable as it cools due to contact with the substrate; and
 c) spinning the substrate so that the first portion of the coating material remains on the substrate and a second portion of the coating material having a lower viscosity than the first portion of the coating material is removed from the substrate.

13. The method according to claim 12 wherein the coating material has a second temperature that is above ambient temperature as the coating material is dispensed onto the substrate.

14. The method according to claim 13 wherein the second temperature is at least 15° C. greater than the first temperature during step b).

15. The method according to claim 14 wherein the first temperature is at or below 15° C. and the second temperature is at or above 30° C.

16. A method of coating a substrate comprising:
 a) positioning a substrate on a support member of a spin module;
 b) blowing a cooling gas onto the substrate while spinning the substrate with the spin module;
 c) dispensing acetone onto the substrate while continuing to blow the cooling gas onto the substrate to reduce a temperature of the substrate to at or below 10° C.;
 d) spinning the substrate with the spin module to remove the acetone from the substrate; and
 e) dispensing a heated coating material onto the substrate, a first portion of the coating material that is in contact with the substrate increasing in viscosity as it cools due to contact with the substrate.

17. The method according to claim 16 wherein during an initial contact between the coating material and the substrate, a temperature differential between the substrate and the coating material is at least 15° C.

18. The method according to claim 16 wherein the dispensing material is heated to at least 30° C. prior to being dispensed onto the substrate.

19. The method according to claim 16 wherein the first portion of the coating material remains on the substrate and a second portion of the coating material having a lower viscosity than the first portion of the coating material is removed from the substrate.

20. The method according to claim 16 wherein during an initial contact between the coating material and the substrate, a temperature differential between the substrate and the coating material is in a range of 20° C. to 40° C.

* * * * *